United States Patent

Reinecke et al.

[11] Patent Number: 6,004,633
[45] Date of Patent: *Dec. 21, 1999

[54] METHOD OF PRODUCING INTEGRATED ELECTRODES IN PLASTIC DIES, PLASTIC DIES CONTAINING INTEGRATED ELECTRODES AND APPLICATION OF THE SAME

[75] Inventors: Holger Reinecke, Rülzheim; Friedolin Franz Nöker, Karlsruhe, both of Germany

[73] Assignee: Microparts Gesellschaft, Dortmund, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/725,178

[22] Filed: Oct. 3, 1996

[30] Foreign Application Priority Data

Oct. 4, 1995 [DE] Germany ............ 195 36 901

[51] Int. Cl.$^6$ .................................. C23C 18/14
[52] U.S. Cl. .................... 427/581; 427/123; 427/404
[58] Field of Search .................... 427/581, 123, 427/404; 204/486; 205/184

[56] References Cited

U.S. PATENT DOCUMENTS 5,405,656  4/1995  Ishikawa et al. ................. 427/581

FOREIGN PATENT DOCUMENTS

| 41 25 863 | 2/1993 | Germany . |
| 4125863 | 2/1993 | Germany . |
| 60-218580 | 9/1987 | Japan . |
| WO 94/06952 | 3/1994 | WIPO . |

OTHER PUBLICATIONS

Patent Abstracts of Japan, vol. 9, No. 32, (C–265) [1755], Feb. 9, 1985, JP–59–177385, Oct. 8, 1984.

*Primary Examiner*—Kishor Mayekar
*Attorney, Agent, or Firm*—Oblon, Spivak, McClelland, Maier & Neustadt, P.C.

[57] ABSTRACT

Patterned dies made of non-conductive resins may be equipped with integrated electrodes in different manners. It is proved to be difficult to produce high-quality electrodes especially in microstructured dies. A patterned plastic die arranged on a carrier plate is filled with a solution of a metal compound. This solution is irradiated through the carrier plate from the back side of the carrier plate using laser light, ultraviolet light or X-rays. The metal compound is transformed in the immediate vicinity of the base of the structure and a metal layer is deposited on the base of the structure forming the electrodes. The method is suitable for a base of the structure forming a coherent or a non-coherent area. Plastic dies containing integrated electrodes are used for electroless or electrophoretic deposition of materials and for electroplating, in all cases starting from the integrated electrodes, and for analytical methods.

8 Claims, 1 Drawing Sheet

METHOD OF PRODUCING INTEGRATED ELECTRODES IN PLASTIC DIES, PLASTIC DIES CONTAINING INTEGRATED ELECTRODES AND APPLICATION OF THE SAME

BACKGROUND OF THE INVENTION

1. Field of the Invention

The present invention relates to a method of producing integrated electrodes in plastic dies containing cavities, to plastic dies with integrated electrodes and to applications of the same.

2. Description of the Related Art DE 35 37 483 describes a method for the formation of a multitude of plate-shaped metallic microstructured bodies by molding a microstructured tool with a non-conductive molding compound. Thus a negative mold of the microstructured tool is filled up with metal by electrodeposition. Then the negative mold is removed. A removable conductive material is applied to the front surface of the tool. During molding this conductive material is transferred to the regions of the molding compound which are in contact with the front surface of the tool.

In a variation of this method, the non-conductive molding compound which fills up the spaces in the microstructured tool may be fixed by a layer of a conductive molding compound. The conductive molding compound contacts and covers the whole front surface of the tool.

DE 40 10 669 describes a method for producing negative molds of plate-shaped microstructured bodies. The base structure of the patterned negative mold forms a coherent area which is covered with a layer of conductive material. This negative mold may be filled with a metal by electroplating. A layer of a thermoplastic resin which is covered with a thin film of a conductive material is used for producing the negative mold. A mold insert is pressed into the heat softened layer of the thermoplastic resin via the thin conductive film. After cooling the thermoplastic resin, the negative mold is separated from the mold insert.

During the stamping process the coherent film of conductive material is split at the front surface of the mold insert corresponding to the pattern of the microstructure. The regions of the conductive film on the front surface of the mold insert stick to the front surface. During stamping the other regions of the film are pushed to the base of the structure of the mold insert by the thermoplastic resin flowing into the cavities of the mold insert.

Pieces of the film may remain as tinsel on the side walls of the structure. If necessary, the tinsel is removed from the negative mold by a laborious cleaning procedure before the negative mold is electroplated with metal. After demolding, the regions of the front surface of the mold insert form the base of the structure of the negative mold. This base is covered with a coherent conductive film which is contactable at its edge.

The tinsel on the side walls and on the front surface of the negative mold comes from the conductive film which is imperfectly split during the stamping process. Some tinsel touches on the conductive layer at the base of the negative mold structure. This results in partially conductive side walls of the structure and the directed deposition of metal in the negative mold is disturbed. Defects, cavities and thicker regions of the metal layer are thus created in the metallic microstructured body molded by electroplating.

The conductive film preferably consists of gold, copper, silver and alloys thereof or of carbon. A film like that on the coherent area of the base of the structure is suitable as an electrode for the electrodeposition of other metals, e.g., copper or nickel. This film is less suitable for the electroless deposition of these metals.

SUMMARY OF THE INVENTION

An object of the invention is to provide a method of producing integrated electrodes in patterned plastics dies more economically and to produce high-quality electrodes even in microstructured dies made of non-conductive resins.

This object is achieved, according to the present invention, by a method including the steps of producing a structured plastic die on a carrier plate which is transparent to electromagnetic radiation, filling the structure of the plastic die with a solution of a metal compound, irradiating the solution of the metal compound with electromagnetic radiation from the back side of the carrier plate via the carrier plate so that the electrodes are formed on the base of the structure, and removing the solution of the metal compound from the structure of the patterned plastic die.

The patterned plastic die is produced by injection molding, reaction molding, thermoforming or some other method using a structured tool. After solidification of the resin within the tool the plastic die is separated from the tool. The resin structure complementary to the structure of the tool is located on a carrier plate having a certain thickness.

For producing the patterned plastic die on a carrier plate either a uniform resin is used or for the carrier plate a resin is used which is different from the resin used for the patterned layer. In the latter case, inter alia, the transparency of the resin for the carrier plate may be matched to the wavelength of the electromagnetic radiation applied. The carrier plate may be machined down from its back side to a thickness and a surface condition suitable for irradiation.

Suitable thermoplastic resins include, e.g., poly(methyl methacrylate), poly(oxymethylene), acrylonitril-butadiene-styrene and polyamide.

The term "solution of a metal compound" means a solution in the narrow sense, a suspension or a colloidal solution. The metal compound is a compound in the narrow sense, a metal complex or a metal itself. The dissolved metal compound may be an inorganic salt (e.g., silver nitrate, gold sulfite), an organic metal compound (e.g., palladium acetate, silver tosylate) or a metal complex (e.g., an amino complex like diamine silver complex or tetramine copper complex). The solution may contain several metals at the same time.

The solution of the metal compound filled into the cavities of the plastic die is irradiated from the back side through the carrier plate using laser light, ultraviolet light or X-rays. The radiation may enter the whole back side of the carrier plate with the same intensity or may enter the back side after passing a patterned mask which lies loosely on the back side of the carrier plate or which is fixed to the carrier plate as, e.g., a sputtered mask.

After irradiating, the solution of the metal compound is removed from the patterned plastic die (e.g., by rinsing).

During irradiation of the solution through the carrier plate the metal compound is transformed only in the immediate vicinity of the base of the structure, by which the metal is deposited on the base of the structure in a layer thus forming the electrodes. Owing to its lower transparency for the electromagnetic radiation applied, this layer prevents the dissolved metal compound from further transformation as well as the deposition of metal on the side walls of the structure even during continuous irradiation.

The wavelength of the electromagnetic radiation applied and the duration of the irradiation are matched to the resin employed for the carrier plate, to the thickness of the carrier plate and to the nature of the metal compound. If desired, the electrode may be reprecipitated, coated or etched and may be matched to certain requirements of the following process steps.

The base of the structure of the patterned plastic die may be coherent or not coherent. In the first case the integrated electrode is coherent and is therefore contactable at one point. In the second case the integrated electrodes are not coherent and are therefore contactable at several points.

A structure having a coherent electrode is suitable for electroless and electrophoretic deposition of a material as well as for electroplating, starting from the conductive electrode. A structure having non-coherent electrodes is suitable almost only for electroless deposition of a material, starting from the electrodes. Preferably, palladium solutions are used for the formation of electrodes necessary for the electroless deposition of metal. Nickel, copper, gold and other materials can be electrolessly deposited on a palladium electrode.

The electrodes on the base of the structure of the plastic die may consist of one layer or of several layers. The formation of two-layer electrodes starts from a patterned plastic die with integrated electrodes produced according to the method described above. The solution or suspension of a metal, a metal compound, a resin, a sintered material or a ceramic material is filled into the cavities of a patterned plastic die with integrated electrodes. A layer of the dissolved or suspended material is deposited as second layer upon the integrated electrodes. The material may be deposited with or without an electric current. As soon as the second layer has reached its desired thickness the solution or suspension of the material is removed from the patterned plastic die.

This process is repeated several times for the formation of multi-layer electrodes consisting of different materials.

The method according to the invention is preferably applied to microstructured plastic dies consisting of non-conductive resins.

Patterned plastic dies made of non-conductive resins containing integrated electrodes arranged on the base of the structure may be used for various purposes, e.g., for deposition of metal with or without electric current for producing a metallic patterned body, electrophoretic deposition of ceramics, metals, metal alloys, resins or sintered materials for producing a patterned body consisting of one of the deposited materials, an analytical system, preferably macroanalytical systems. In the first two cases the deposition of the material starts on the integrated electrodes. The structure of the body formed by deposited material is complementary to the structure of the plastic die.

The body formed by material deposited in the patterned plastic die containing integrated electrodes may consist of a uniform material or the body may consist of different materials arranged in layers one above the other.

When the patterned plastic die with integrated electrodes has been used for the deposition of material, the plastic die is separated mechanically from the formed structured body or the plastic die is (as dead mold) dissolved out of the structured body. The integrated electrodes are positioned upon the front surface of the structured body and are, if necessary, removed from the front surface, e.g., by selective etching.

The method according to the invention has the following advantages: The integrated electrodes are positioned only on the base area of the structure of the plastic die. No tinsel sticks to the side walls of the structure. The deposition of material with or without electric current in the patterned plastic die starts from the electrodes only. The deposition process proceeds undisturbed; no defects, no thicker regions of the deposited material and no cavities are created during this process within the structured body.

Preferably, such metals are used for the integrated electrodes which are especially suitable for the electroless deposition of material in the plastic die. The embossed unfinished part used for producing the patterned plastic die is employed without any pretreatment. The resin used for the carrier plate may be matched to the irradiation process, the resin used for the patterned layer may be matched to the deposition process. The electrodes arranged on the base of the structure are formed separately from the production of the plastic die. After removal of the solution of the metal compound out of the patterned plastic die, this die may be used directly for the deposition process. The plastic die may be mechanically separated from the structured body formed by deposition of material. Optionally this die may be used repeatedly. The plastic die containing integrated electrodes is suitable for electroless or electrophoretic deposition and for electrodeposition of material within the plastic die as well as for analytical methods.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENT

Figure 1A:
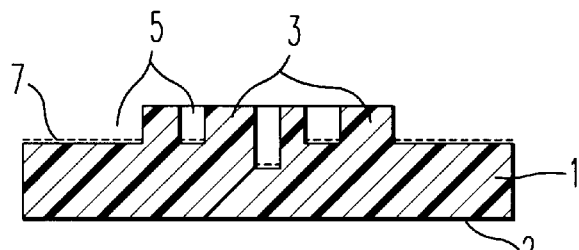
FIG. 1 shows a plastic die having a grid-like structure in plan view and in longitudinal view.

FIG. 1 shows a plastic die having a grid-like structure in plan view and in longitudinal view. The grid (3) protrudes above the carrier plate (1) having a smooth back side (2). The grid forms a coherent area (4). Within and outside this area are insular cavities (5). The base of the structure has an insular pattern and forms a non-coherent area (6). Integrated electrodes (7) are arranged on the base of the structure.

Figure 2A:
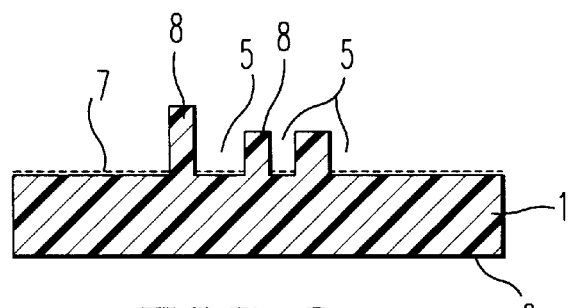
FIG. 2 shows a patterned plastic die having an insular structure in plan view and in longitudinal view.

FIG. 2 shows a patterned plastic die having an insular structure in plan view and in longitudinal view. Islands (8) protrude above the carrier plate (1) having a smooth back side (2). Cavities (5) are arranged between the islands. The base of the structure is grid-like and forms a coherent area. An integrated electrode (7) is arranged on the base of the structure.

EXAMPLE 1

Manufacturing of Microstructured Filter Disks.

The filter disks to be made of nickel have a hexagonal honeycomb pattern with following dimensions:

Outside diameter of the disks: 3 mm

Diameter of the inside circle of the honeycombs: 80 $\mu$m

Width of the honeycomb walls: 8 $\mu$m

Height of the honeycomb walls: 270 to 280 $\mu$m

The plastic die has a complementary structure but a height of the pattern of 300 $\mu$m.

The microstructured tool made of nickel the structure of which corresponds to the structure of the filter disks contains structures for a total of 105 filter disks on an area of 60 mm×22 mm. Using this tool 105 plastic dies made of poly(methyl methacrylate) are produced, the microstructure of which in the patterned layer is complementary to the microstructure of the tool. The microstructure 300 μm high is arranged on a carrier plate 1.5 mm thick made of poly (methyl methacrylate).

The cavities of the patterned plastic die are coherent within each filter disk. However, between the cavities of two filter disks no connection exists. So the base of the structure of all 105 filter disks together is not coherent.

First, the cavities of the patterned plastic die are filled free of bubbles with an aqueous solution containing 0.3 mol silver acetate per liter. The plastic die is irradiated for 2 minutes by means of a mercury-vapor lamp (100 W power) arranged in a distance of 1.5 cm from the back side of the carrier plate. During this irradiation electrodes are formed as dense silver layers on the base of the structure of the plastic die. The silver acetate solution is sucked out of the plastic die and the plastic die is rinsed with high-purity water.

Then the cavities of this patterned plastic die are filled free of bubbles with an aqueous solution containing 2.0 mmol palladium chloride per liter. After 15 minutes at room temperature the silver layer on the base of the structure is replaced by a palladium layer. The palladium chloride solution is sucked out of the plastic die and the plastic die is rinsed with high-purity water. The non-coherent palladium layer forms electrodes on the base of the structure of the plastic die.

The plastic die is immersed in a solution of 50 g nickel chloride per liter for the electroless deposition of nickel in the cavities of the plastic die. After 21 hours at about 60° C. the cavities of the plastic die are filled with nickel to a height of 276 μm.

The plastic die filled with nickel is removed from the nickel bath and is rinsed with high-purity water. Finally, the plastic die is dissolved in hot ethyl acetate by which the filter disks are separated from the plastic die and are present as isolated pieces. So the additional partition of the filter disks by mechanical reworking of the outside contours is neither necessary nor permissible due to the narrow dimensional tolerances and the required low roughness.

EXAMPLE 2

Producing a Heatable Analytical Device.

An analytical device consists of a Y-shaped flow splitter containing electrodes on the coherent area of the base of the structure. A liquid passing this structure is heated by means of electrically heated electrodes.

A plastic die made of polysulfon (10 mm wide, 20 mm long, 3 mm thick) is produced by injection molding. The Y-shaped channel is 1 mm wide and 1 mm deep. A solution containing 0.1 mol gold sulfate per liter is filled into the cavities of the structure. The plastic die is irradiated from its back side using an ultraviolet lamp (1 kW power) which is arranged at a distance of 40 cm from the plastic die. A convex quartz lens is located between the ultraviolet lamp and the plastic die. After 45 minutes irradiation time a dense gold layer is formed on the base of the structure. The solution of gold sulfite is removed from the plastic die and the die is rinsed with high-purity water.

Then the plastic die is immersed in a solution from which a copper-nickel alloy is deposited electrolytically. The current density is 1 A/dm$^2$. A layer 1.2 μm thick is formed on the base of the structure within 10 minutes at 65° C. The plastic die is taken out of the bath and is rinsed and dried. A plastic cover plate is applied over the die. Lead-in wires are fixed to the electrodes. A liquid in the Y-shaped flow splitter is heated by resistance heating.

This device is used within an analytical system for heating up a liquid in which system a chemical reaction is investigated photometrically.

Obviously, numerous modifications and variations of the present invention are possible in light of the above teachings. It is therefore to be understood that the invention may be practiced otherwise than as specifically described herein.

What is claimed as new and desired to be secured by Letters: Patent of the United States is:

1. A method of producing integrated electrodes in patterned plastic dies made of non-conductive resins, comprising the steps of:

producing a patterned plastic die arranged on an upper side of a carrier plate, said carrier plate being transparent to electromagnetic radiation and said patterned plastic die having cavities, said cavities each having a bottom, filling the cavities of the patterned plastic die with a solution of a metal compound, irradiating the solution of the metal compound with electromagnetic radiation from an underside of the carrier plate, said underside being the back side of the carrier plate, via the carrier plate, to deposit a metal layer on the bottoms of the cavities to form the integrated electrodes, and removing the solution of the metal compound from the cavities of the patterned plastic die.

2. The method according to claim 1, wherein the patterned plastic die and the carrier plate are made of a uniform resin.

3. The method according to claim 1, wherein the patterned plastic die consists of a first resin and the carrier plate consists of a second resin.

4. The method according to claim 1, further comprising the step of machining the back side of the carrier plate to a thickness and surface smoothness suited for irradiation.

5. The method according to claim 1, comprising the step of filling the cavities of the patterned plastic die with the solution of one of an inorganic salt, an organic salt and a metal complex.

6. The method according to claim 1 wherein the step of irradiating the solution of the metal compound uses one of laser light, ultraviolet light and X-rays.

7. The method according to claim 1 comprising the step of partially irradiating the solution of the metal compound with regionally different intensity.

8. The method according to claim 1 comprising the step of irradiating the solution of the metal compound through a mask which is arranged on the back side of the carrier plate and which is locally impermeable to the applied electromagnetic radiation.

\* \* \* \* \*

UNITED STATES PATENT AND TRADEMARK OFFICE
CERTIFICATE OF CORRECTION

PATENT NO. : 6,004,633

DATED : DECEMBER 21, 1999

INVENTOR(S): HOLGER REINECKE ET AL

It is certified that an error appears in the above-identified patent and that said Letters Patent is hereby corrected as shown below:

Column 2, line 20, after "structure" insert --(bottoms of the cavities)--.

Column 3, line 49, change "macro-" to --micro- --.

Figure 1B:
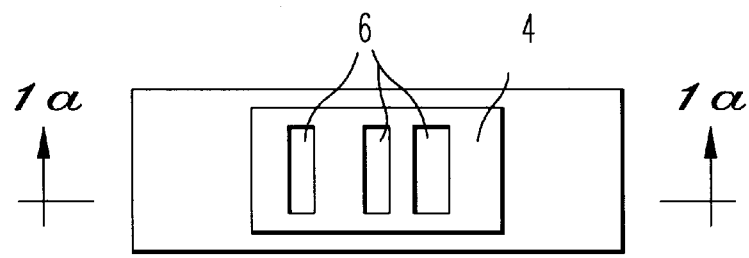
Figure 2B:
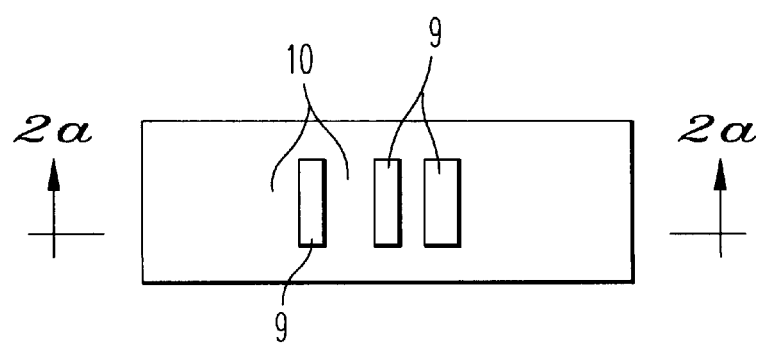

Column 4, line 34, change "1" to --1a--;
line 34, before "plastic" insert --patterned--;
line 35, after "and" insert --, and FIG. 1b shows the same structure--;
line 36, change "2" to --2a--;
line 37, after "and" insert --, and FIG. 2b shows the same structure--.
line 41, change "1" to --1a--;
line 41, before "plastic" insert --patterned--;
line 42, after "and" insert --, and FIG. 1b shows the same structure--;
line 48, change "2" to --2a--;
line 49, after "and" insert --, and FIG. 2b shows the same structure--.

Column 5, line 53, change "sulfate" to --sulfite--.

Signed and Sealed this

Fifteenth Day of May, 2001

*Attest:*

NICHOLAS P. GODICI

*Attesting Officer*      *Acting Director of the United States Patent and Trademark Office*